US005300768A

United States Patent [19]
Wakikaido et al.

[11] Patent Number: 5,300,768

[45] Date of Patent: Apr. 5, 1994

[54] INCLUDING A PROCESSING MEANS FOR DRIVING DESIGNATED PHOTOELECTRIC DETECTORS FOR THE CHECKING THEREOF

[75] Inventors: Takahiro Wakikaido; Takeshi Sakaguchi, both of Osaka, Japan

[73] Assignee: Mita Industrial Co., Ltd., Japan

[21] Appl. No.: 1,765

[22] Filed: Jan. 7, 1993

[30] Foreign Application Priority Data

Jan. 17, 1992 [JP] Japan ................................ 4-027241

[51] Int. Cl.⁵ ........................... H01J 40/14; H02J 1/00
[52] U.S. Cl. ................................. 250/208.3; 307/40; 324/158 D; 250/221
[58] Field of Search ............... 250/208.2, 208.3, 208.4, 250/208.5, 208.1, 561, 221; 307/38-41, 112, 173, 115; 324/158 D

[56] References Cited

U.S. PATENT DOCUMENTS

| | | | |
|---|---|---|---|
| 3,975,683 | 8/1976 | Behrens et al. | 324/158 D |
| 4,298,869 | 11/1981 | Okuno | 257/88 |
| 4,309,696 | 1/1982 | Nagai et al. | 250/221 |
| 4,346,347 | 8/1982 | Kamata et al. | 324/158 D |
| 4,459,547 | 7/1984 | Miller | 324/158 D |
| 4,639,608 | 1/1987 | Kuroda | 358/475 |
| 4,672,195 | 6/1987 | Gulborne et al. | 250/222.1 |
| 4,818,866 | 4/1989 | Weber | 250/221 |
| 5,015,840 | 5/1991 | Blau | 250/221 |

*Primary Examiner*—Michael Messinger
*Attorney, Agent, or Firm*—Beveridge, DeGrandi, Weilacher & Young

[57] ABSTRACT

An image forming apparatus according to the present invention includes a first processing device which processes in a normal mode for dynamically driving photoelectric detectors in groups so as to sequentially read detection signals from the photoelectric detectors in the groups, second processing device which process in a photoelectric detector check mode for driving a designated group of photoelectric detectors. Switching between processes by the processors is accomplished by a switching device. When the photoelectric detectors are checked, the photoelectric detector driving mode is switched from the normal mode to the photoelectric detector check mode by the switching device.

4 Claims, 4 Drawing Sheets

INCLUDING A PROCESSING MEANS FOR DRIVING DESIGNATED PHOTOELECTRIC DETECTORS FOR THE CHECKING THEREOF

BACKGROUND OF THE INVENTION

1. Field of the Invention

The present invention relates to image forming apparatuses such as a copying machine.

2. Description of the Prior Art

In a copying machine or the like, a lot of photointerruptors have been used so as to detect information required for control, for example, the size of recording paper, the position of recording paper, and the presence or absence of recording paper.

FIG. 4 shows a circuit for inputting detection signals of photointerruptors provided for paper feeding decks in a copying machine. In this example, the copying machine is provided with four paper feeding decks, and each of the paper feeding decks is provided with eight photointerruptors 1 to 32. Consequently, the total number of the photointerruptors provided for the four paper feeding decks is 32.

The 32 photointerruptors 1 to 32 are divided into four groups for each paper feeding deck. Output terminals of the eight photointerruptors for each of the groups are connected to eight input terminals I1 to I8 of a control section 300 of the copying machine through a three-state buffer 41, 42, 43 or 44 provided for the group. The control section 300 comprises a CPU (Control Processing Unit), a ROM (Read Only Memory) for storing its program and the like, a RAM (Random Access Read Write Memory) storing necessary data, and the like. Selection signal input terminals E of the four three-state buffers 41 to 44 are respectively connected to four different selection signal output terminals S1 to S4 of the control section 300. Each of the photointerruptors 1 to 32 is statically driven.

The control section 300 divides the three-state buffers 41 to 44 for the respective groups in time and sequentially selects the three-state buffers by selection signals, thereby to read detection signals of the photointerruptors 1 to 32 with the groups divided in time for each group.

Such a circuit for inputting detection signals of photointerruptors is complicated and the cost thereof is high. Accordingly, the applicant of the present application develops a circuit for inputting detection signals of photointerruptors as shown in FIG. 1. In this circuit, output terminals of eight photointerruptors for each group are directly connected to eight input terminals I1 to I8 of a control section 100 of a copying machine without passing through three-state buffers. The control section 100 comprises a CPU, and a ROM for storing its program and the like, a RAM storing necessary data, and the like. Driving power is supplied to the photointerruptors for each group through a switching transistor 51, 52, 53 or 54 provided for the group. Bases of the four switching transistors 51 to 54 are respectively connected to four different selection signal output terminals S1 to S4 of the control section 100.

The control section 100 divides the four switching transistors 51 to 54 in time and sequentially turns the switching transistors on by selection signals, thereby to dynamically drive photointerruptors 1 to 32 in units of groups. Specifically, the control section 100 drives the photointerruptors 1 to 32 by groups, according to a particular time for each group, thereby to read detection signals of the photointerruptors 1 to 32 with the groups divided in time for each group.

The above described circuit for inputting detection signals of photointerruptors shown in FIG. 1 has the disadvantage in that the photointerruptors 1 to 32 are dynamically driven, thereby to make it impossible to check to see whether or not each of the photointerruptors 1 to 32 is normal by a tester.

An object of the present invention is to provide, in an image forming apparatus in which a plurality of photoelectric detectors are divided into a plurality of groups, and the photoelectric detectors are dynamically driven in units of groups, whereby detection signals of the photoelectric detectors are read with the groups divided in time for each group, the image forming apparatus capable of checking the photoelectric detectors.

SUMMARY OF THE INVENTION

An image forming apparatus according to the present invention is an image forming apparatus in which a plurality of photoelectric detectors are divided into a plurality of groups, and the photoelectric detectors are dynamically driven in groups, whereby detection signals of the photoelectric detectors are read in groups at a time for each group, which is characterized by comprising first processing means for executing a normal mode for dynamically driving the photoelectric detectors in groups so as to read the detection signals of the photoelectric detectors in the groups in time, second processing means for executing a photoelectric detector check mode for statically driving the photoelectric detectors for the designated group so as to check the photoelectric detectors, and switching means for switching the normal mode and the photoelectric detector check mode.

Used as the above described switching means is, for example, one comprising first input means for designating a group of photoelectric detectors to be checked out of a plurality of groups to select a photoelectric detector check mode, second input means for releasing the photoelectric detector check mode, first switching means for switching the mode from the normal mode to the photoelectric detector check mode when the photoelectric detector check mode is selected by the first input means, and second switching means for switching the mode from the photoelectric detector check mode to the normal mode when a photoelectric detector check mode release command is inputted by the second input means.

In the image forming apparatus according to the present invention, the normal mode for dynamically driving the photoelectric detectors in groups so as to read the detection signals of the photoelectric detectors of the groups in time and the photoelectric detector check mode for statically driving the photoelectric detectors for the designated group so as to check the photoelectric detectors, are switched by the switching means. Consequently, the photoelectric detectors are checked by selecting the photoelectric detector check mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
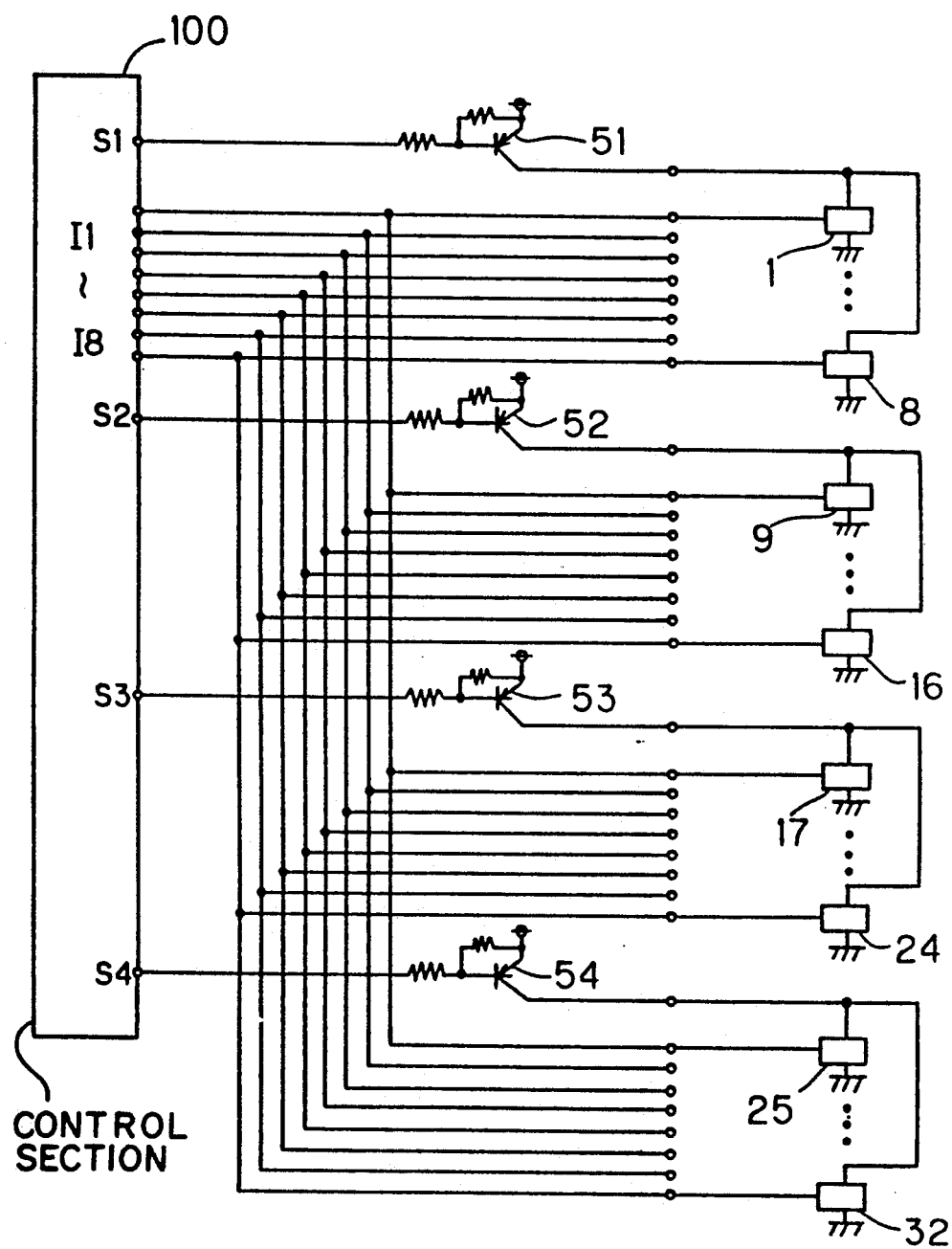
FIG. 1 is a circuit diagram showing a circuit for inputting detection signals of photointerruptors.

Referring now to the drawings, description is made of an embodiment in a case where the present invention is applied to a copying machine.

Figure 2:
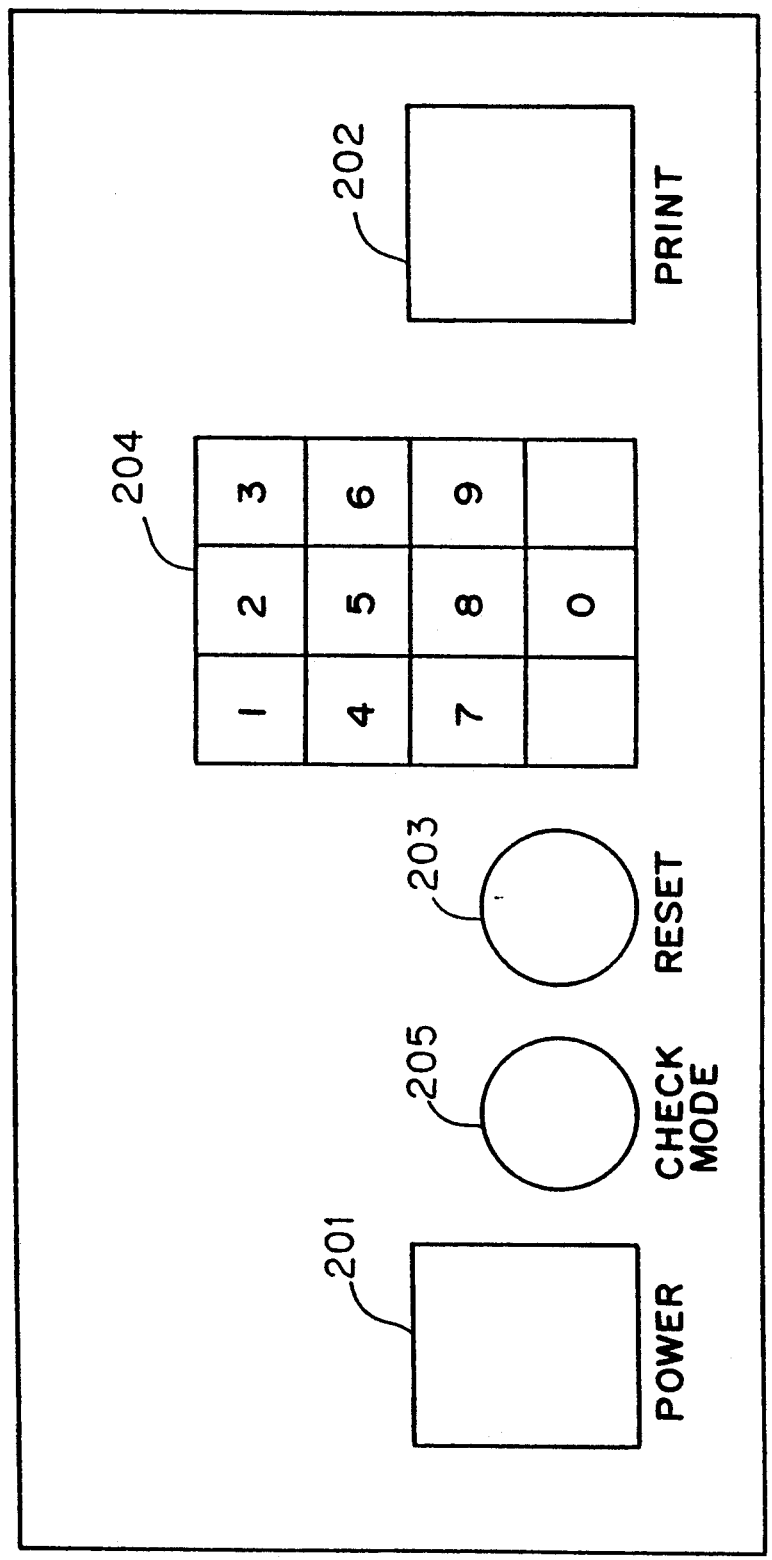
FIG. 2 is a schematic diagram showing an operating section of a copying machine.

The construction of a circuit for inputting detection signals of photointerruptors in the present embodiment is the same as that of the circuit shown in FIG. 1 and hence, the description thereof is not repeated. In this copying machine, an operating section is provided with a check mode selecting key 205 in addition to keys usually provided in the copying machine, for example, a power key 201, a print key 202, a reset key 203, and a ten key 204, as shown in FIG. 2. The operating section is connected to a control section 100.

Photointerruptors 1 to 32 are always dynamically driven in groups of eight photointerruptors. Specifically, four switching transistors 51 to 54 are sequentially turned on by selection signals outputted from selection signal output terminals S1 to S4, whereby the photointerruptors 1 to 32 are dynamically driven in groups. Consequently, detection signals of the 32 photointerruptors 1 to 32 are read in the control section 100 by groups with a time for each group. Such a processing mode is referred to as a normal mode.

In this copying machine, there is provided a check mode for checking the photointerruptors 1 to 32 in addition to the normal mode. When a worker desires to check the photointerruptors 1 to 32, the check mode selecting key 205 is first turned on, a group number of the group of photointerruptors 1 to 8, 9 to 16, 17 to 24 or 25 to 32 which is to be checked is inputted by the ten key 204, and the print key 202 is depressed. Consequently, processing in the check mode is started. When the check mode is terminated, the worker depresses the reset key 203.

Figure 3:
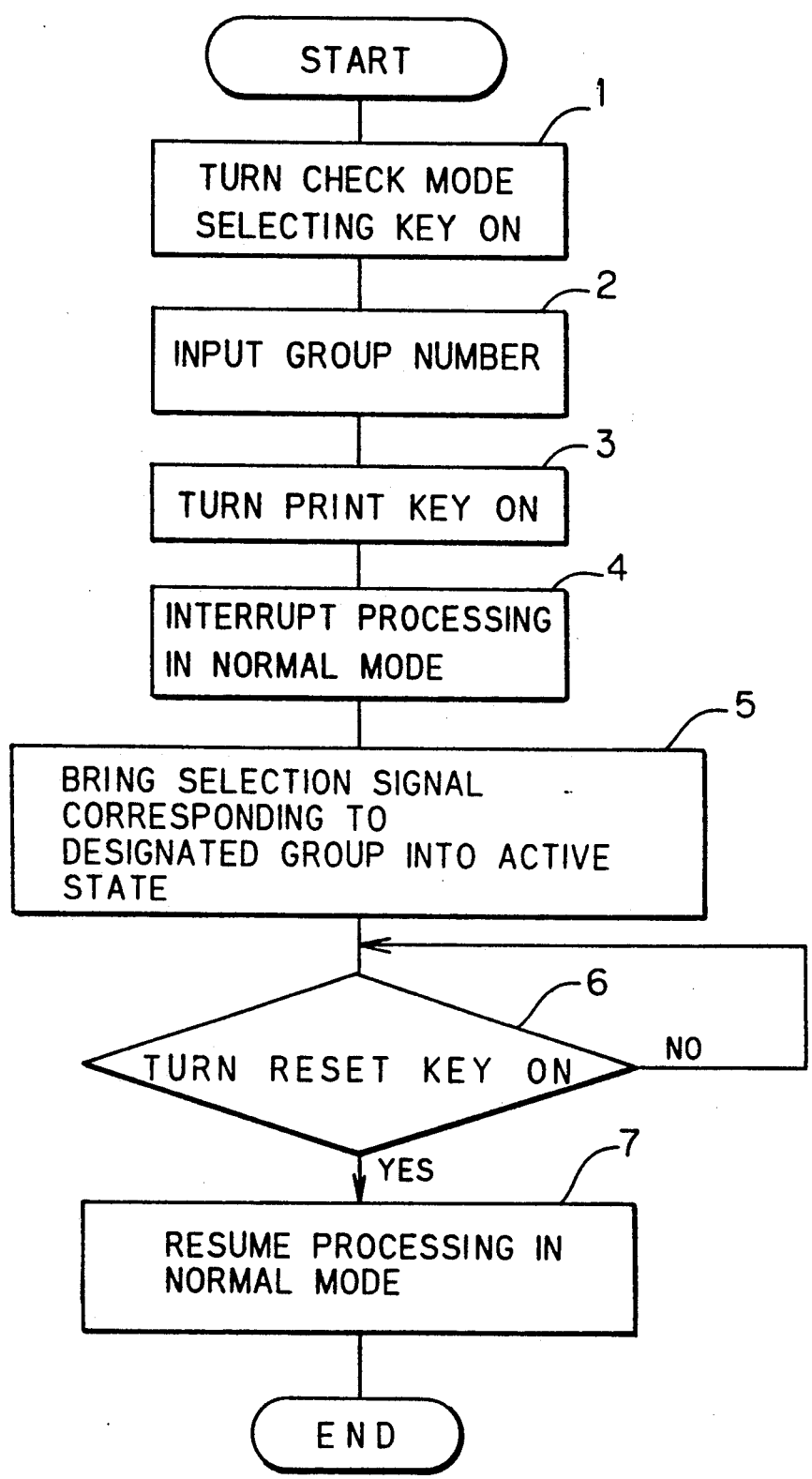
FIG. 3 is a flow chart showing the procedure for mode switching processing performed by a control section.
Figure 4:
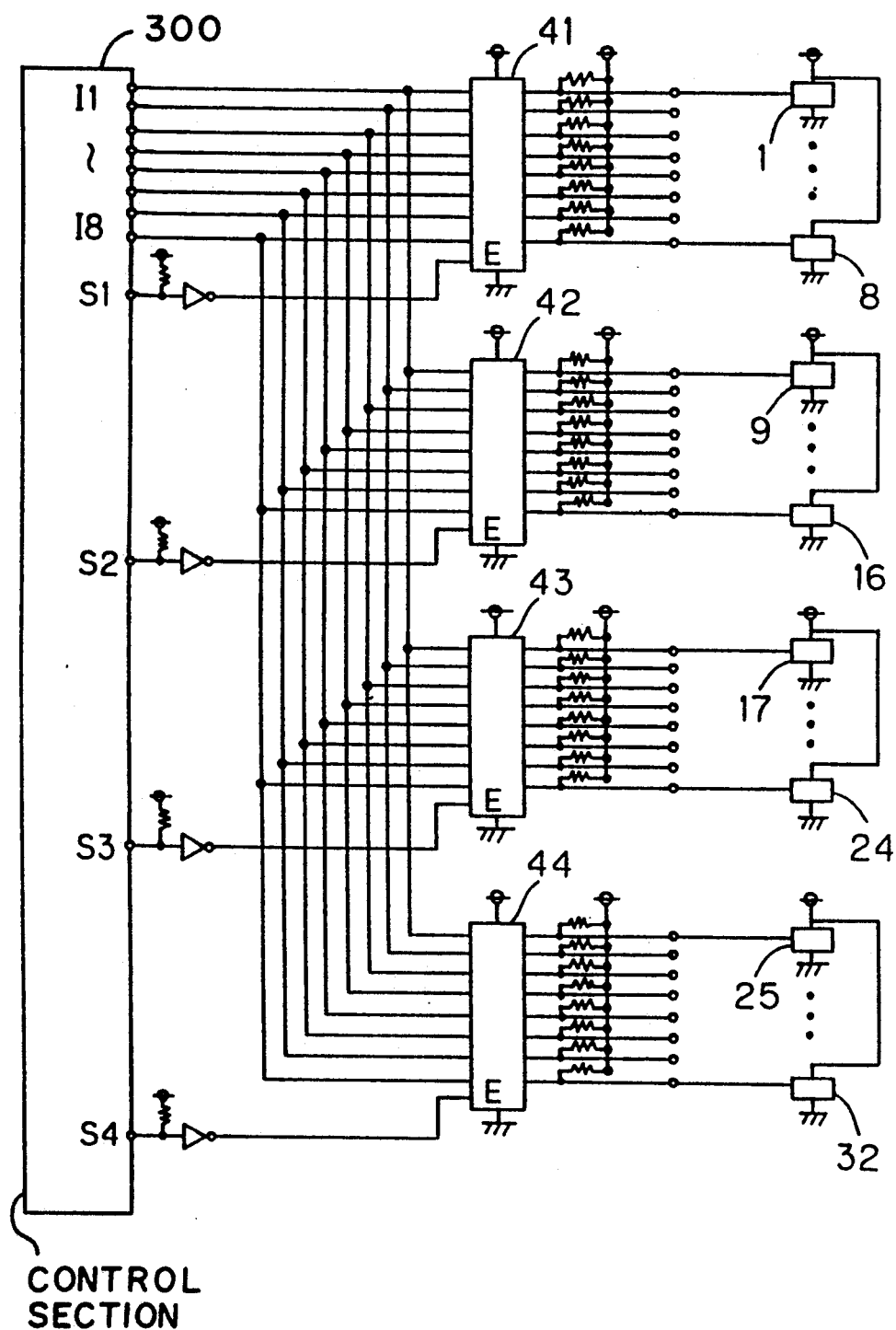
FIG. 4 is a circuit diagram showing a conventional example of a circuit for inputting detection signals of photointerruptors.

FIG. 3 shows the procedure for mode switching processing performed by the control section 100 of the copying machine.

When processing in the normal mode is executed, the check mode selecting key 205 is turned on by the worker (step 1) and then, the group number is inputted at the ten key 204 (step 2), the print key 202 is turned on (step 3), and the processing in the normal mode is interrupted (step 4), so that processing in the check mode is started.

Specifically, only the selection signal of the group corresponding to the inputted group number is brought into an active state, and the state is held (step 5). Consequently, only the switching transistor 51, 52, 53 or 54 for the group corresponding to the inputted group number is turned on, so that the photointerruptors 1 to 8, 9 to 16, 17 to 24 or 25 to 32 in the group corresponding to the inputted group number are driven (i.e. statically driven).

In this case, acceptance of signal inputs from the input terminals I1 to I8 is inhibited. Thereafter, check and maintenance work for the photointerruptors is performed by the worker. When the check and maintenance work for the photointerruptors is terminated, so that the worker turns the reset key 203 on (step 6), the processing in the normal mode is resumed (step 7).

In the present embodiment, the photointerruptors 1 to 8, 9 to 16, 17 to 24 or 25 to 32 in the group which is desired to be checked can be statically driven by an input operation performed by the worker, thereby to make it possible to check the photointerruptors 1 to 8, 9 to 16, 17 to 24 or 25 to 32 in the group.

Although in the above described embodiment, description was made of the circuit for inputting detection signals of the photointerruptors provided for the paper feeding decks in a copying machine, the present invention is also applicable to a circuit for inputting detection signals of other photointerruptors, for example, photointerruptors used for, for example, detecting the position of an optical system, detecting the opened or closed states of various covers, or determining whether or not a developing device is mounted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An image forming apparatus in which a plurality of photoelectric detectors are divided into a plurality of groups of detectors, and in which said photoelectric detectors in said groups are dynamically driven, whereby detection signals produced by said photoelectric detectors in each group are read according to predetermined timing, said apparatus comprising:

first processing means for executing a normal mode wherein said groups of detectors are dynamically driven according to said timing;

second processing means for executing a photoelectric detector check mode wherein a designated group of said detectors is statically driven, whereby detection signals produced by said detectors of said designated groups are readable so as to check said photoelectric detectors of said designated group; and switching means for switching between processing by said first processing means and processing by said second processing means to selectively place said apparatus in said normal mode or said photoelectric detector check mode.

2. The image forming apparatus according to claim 1, wherein said switching means comprises:

first input means for designating a group of photoelectric detectors from among said plurality of groups during execution of said photoelectric detector check mode, first switching means for switching from said normal mode to said photoelectric detector check mode, second input means for providing a release command for releasing said photoelectric detector check mode, second switching means for switching from said photoelectric detector check mode to said normal mode in response to a release command from said second input means.

3. A processing apparatus for an image forming machine in which a plurality of photoelectric detectors are divided into a plurality of groups of detectors, and in which the groups of detectors are dynamically drivable such that detector signals produced by the detectors in each group of detectors can be read according to a predetermined timing, said apparatus comprising:
   first processing means for executing a normal mode which causes dynamic driving of the groups of detectors according to said timing;
   second processing means for executing a detector check mode which causes static driving of a designated group of the detectors whereby only detection signals produced by the detectors of said designated group are readable to provide for checking of the detectors of said designated group; and
   switching means for switching between said normal mode and said detector check mode.

4. The processing apparatus according to claim 3, wherein said switching means comprises:
   first input means for designating a group of photoelectric detectors from among the plurality of groups during execution of said photoelectric detector check mode,
   first switching means for switching from said normal mode to said detector check mode,
   second input means for providing a release command for releasing said detector check mode,
   second switching means for switching from said detector check mode to said normal mode in response to a release command from said second input means.

* * * * *